(12) United States Patent  
Shimonishi et al.

(10) Patent No.: US 11,422,198 B2
(45) Date of Patent: Aug. 23, 2022

(54) BATTERY LIFE ESTIMATION SYSTEM AND METHOD

(71) Applicant: DENSO CORPORATION, Kariya (JP)

(72) Inventors: Yuta Shimonishi, Kariya (JP); Shuhei Yoshida, Kariya (JP)

(73) Assignee: DENSO CORPORATION, Kariya (JP)

( * ) Notice: Subject to any disclaimer, the term of this patent is extended or adjusted under 35 U.S.C. 154(b) by 601 days.

(21) Appl. No.: 16/418,128

(22) Filed: May 21, 2019

(65) Prior Publication Data

US 2019/0361077 A1 Nov. 28, 2019

(30) Foreign Application Priority Data

May 25, 2018 (JP) .............................. JP2018-100260

(51) Int. Cl.
```
G01R 31/392      (2019.01)
H01M 10/42       (2006.01)
H01M 10/0525     (2010.01)
H01M 10/052      (2010.01)
H01M 10/48       (2006.01)
H01M 6/50        (2006.01)
H01M 10/04       (2006.01)
```

(52) U.S. Cl.
CPC ........ *G01R 31/392* (2019.01); *H01M 10/045* (2013.01); *H01M 10/0525* (2013.01); *H01M 10/425* (2013.01); *H01M 6/50* (2013.01); *H01M 10/052* (2013.01); *H01M 10/42* (2013.01); *H01M 10/48* (2013.01); *H01M 2010/4271* (2013.01); *Y02E 60/10* (2013.01); *Y02P 70/50* (2015.11)

(58) Field of Classification Search
CPC .............. G01R 31/392; H01M 10/045; H01M 10/0525; H01M 10/425; H01M 2010/4271; H01M 10/48; H01M 10/052; H01M 10/42; H01M 6/50; Y02E 60/10; Y02P 70/50
See application file for complete search history.

(56) References Cited

U.S. PATENT DOCUMENTS

2018/0259584 A1* 9/2018 Yan ...................... H01M 10/48

FOREIGN PATENT DOCUMENTS

| CN | 103728561 A | * | 4/2014 | ............. G01R 31/36 |
| CN | 106298251 A | * | 1/2017 | |
| CN | 107925134 A | * | 4/2018 | ............. B60L 53/00 |

(Continued)

*Primary Examiner* — Daniel R Miller
*Assistant Examiner* — Christian T Bryant
(74) *Attorney, Agent, or Firm* — Oliff PLC

(57) ABSTRACT

To provide a battery service life estimation system capable of improving estimation accuracy, a new battery service life estimation system includes an intersection time estimation unit and a service life estimation unit. In view of a relation between a cumulative usage period and a capacity retention0 rate of a secondary battery containing a non-aqueous electrolyte, the intersection time estimation unit estimates a prediction line intersection time tx when an anode service life prediction line intersects with a cathode service life prediction line on a plane coordinate system. The service life estimation unit estimates a battery service life by using the anode service life prediction formula before a point of the prediction line intersection time tx and the cathode service life prediction formula described the prediction line intersection time tx.

8 Claims, 8 Drawing Sheets

(56) References Cited

FOREIGN PATENT DOCUMENTS

| JP | 2013-254710 A | 12/2013 |
| JP | 2016156771 A | 9/2016 |
| JP | 2017228389 A | 12/2017 |

* cited by examiner

INITIAL STAGE

ANODE DEGRADATION STAGE

CATHODE DEGRADATION STAGE

<PRINCIPLE OF DETECTING ANODE RESISTANCE>

BATTERY LIFE ESTIMATION SYSTEM AND METHOD

CROSS-REFERENCE TO RELATED APPLICATION

This patent application is based on and claims priority to Japanese Patent Application No. 2018-100260, filed on May 25, 2018 in the Japan Patent Office, the entire disclosure of which is hereby incorporated by reference herein.

BACKGROUND

Technical Field

Embodiments of the present disclosure relate to a battery service life estimation system and method to estimate a service life of a secondary battery.

Related Art

In the past, a system that estimates a remaining service life of a lithium-ion secondary battery or the like has been known. For example, a conventional system estimates a remaining service life of a battery in view of a phenomenon in which a capacity decreases with increasing speed in the end stage of a battery service life. Thus, the conventional system estimates the remaining service life of the battery by using a formula that employs an exponential function in a first term and a square root function in a second term thereof. In such a conventional technology, the exponential function is employed to represent a phenomenon in which gradual degradation appears in a first stage and rapid degradation in the final stage, respectively. However, a degradation performance actually appearing in the ending stage is different from the exponential function. Thus, the conventional technology simply suggests mathematical adjustment and cannot accurately estimate the remaining service life. The present disclosure offers a novel battery service life estimation system that improves service life estimation accuracy.

SUMMARY

Accordingly, one aspect of the present disclosure provides a novel battery service life estimation system that includes an intersection time estimation unit and a service life estimation unit. To investigate a relation between a cumulative usage period and a capacity retention rate of a secondary battery that contains a nonaqueous electrolyte, the intersection time estimation unit 8 estimates a prediction line intersection time when an anode life prediction line intersects with a cathode service life prediction line on a plane coordinate defined by coordinate axes of the cumulative usage period and the capacity retention rate. The anode service life prediction line is obtained by using an anode service life prediction formula that calculates a service life of an anode. The cathode service life prediction line is obtained by using a cathode service life prediction formula that calculates a service life of a cathode. The service life estimation unit estimates a battery service life by using both of the anode service life prediction formula before a point of the prediction line intersection time and the cathode service life prediction formula after the point of the prediction line intersection time, respectively. Specifically, one embodiment of the present disclosure focuses on a phenomenon in which degradation of an anode prevails in the initial stage of a cumulative usage period of a battery and that of a cathode prevails in the end stage of the cumulative usage period of a battery (i.e., after the point of the prediction line intersection time). That is, a capacity retention rate of the anode is lower than a capacity retention rate of the cathode in the early stage of the cumulative usage period, and the capacity retention rate of the cathode becomes lower than the capacity retention rate of the anode in the end stage of the cumulative usage period. In this respect, a battery service life estimation system of one embodiment of the present disclosure stores an anode service life prediction formula and a cathode service life prediction formula. Then, when it is determined that the cumulative usage period has reached a prediction line intersection time, the anode service life prediction formula is changed to the cathode service life prediction formula to estimate the battery service life. That is, by using the cathode service life prediction formula, the battery service life can be highly precisely estimated in the end stage of the battery service life. Specifically, in the anode service life prediction formula, an anode capacity degradation rate is indicated by a square root function of a cumulative usage period. By contrast, in the cathode service life prediction formula, a cathode capacity degradation rate is indicated by an exponentiation function with a bottom of a cumulative usage period. Further, an exponent p of the exponentiation function is larger than a value 0.5 (i.e., 0.5<p). When it is assumed that a cathode capacity is greater than an anode capacity in the initial stage, the anode service life prediction line obtained by calculating the anode service life prediction formula intersects with the cathode service life prediction line obtained by calculating the cathode service life prediction formula during the cumulative usage period. Hence, by using such formulas, degradation performance of the battery service life is highly precisely reflected in the end stage.

BRIEF DESCRIPTION OF THE DRAWINGS

A more complete appreciation of the present disclosure and many of the attendant advantages of the present disclosure will be more readily obtained as substantially the same becomes better understood by reference to the following detailed description when considered in connection with the accompanying drawings, wherein.

DETAILED DESCRIPTION

Figure 1:
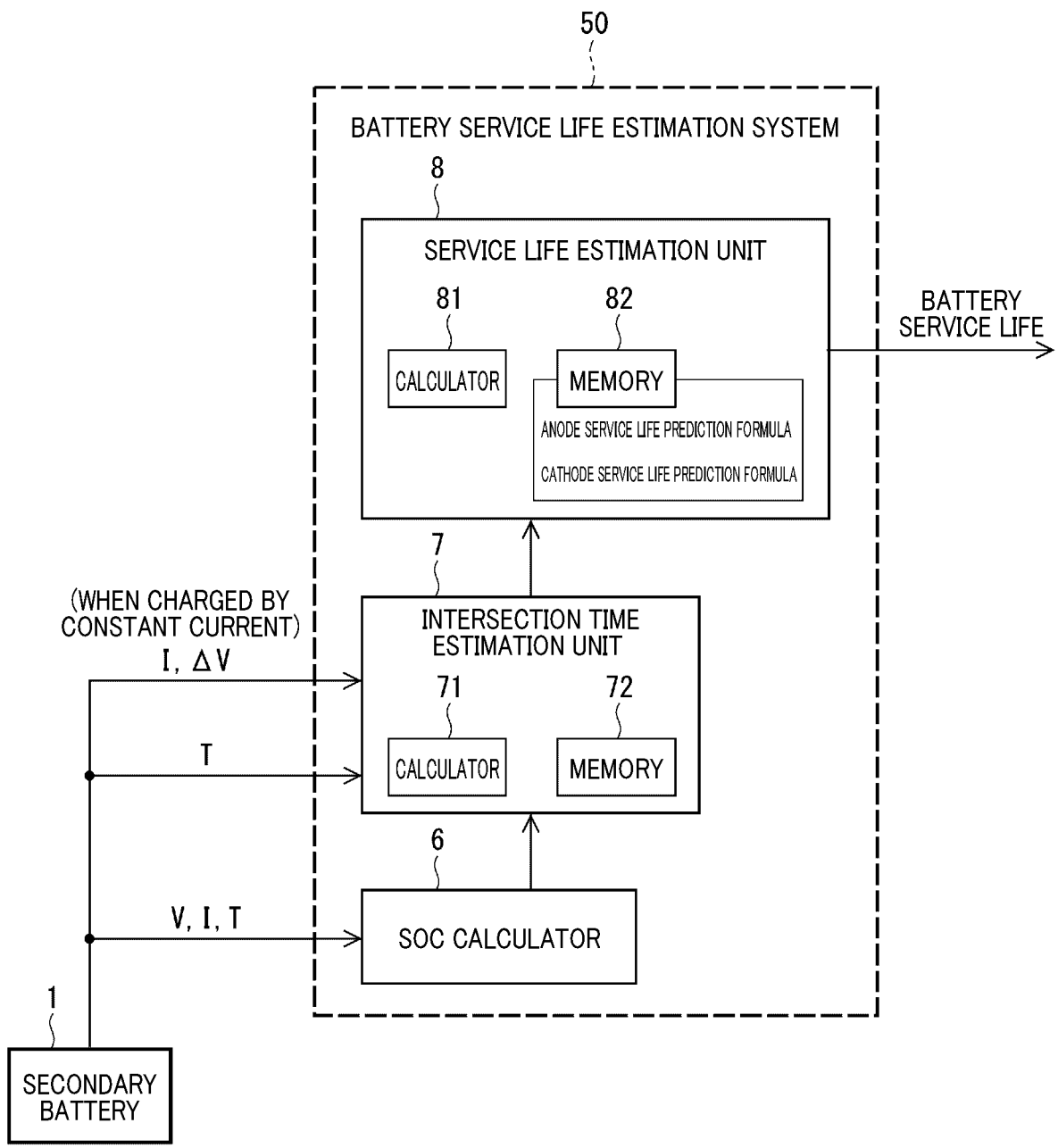
FIG. 1 is a block diagram schematically illustrating an exemplary configuration of a battery service life estimation system according to one embodiment of the present disclosure.

Referring now to the drawings, wherein like reference numerals designate identical or corresponding parts throughout the several views thereof, and in particular to FIG. 1 and applicable drawings, a battery service life estimation system is described according to one embodiment of the present disclosure.

Figure 2:
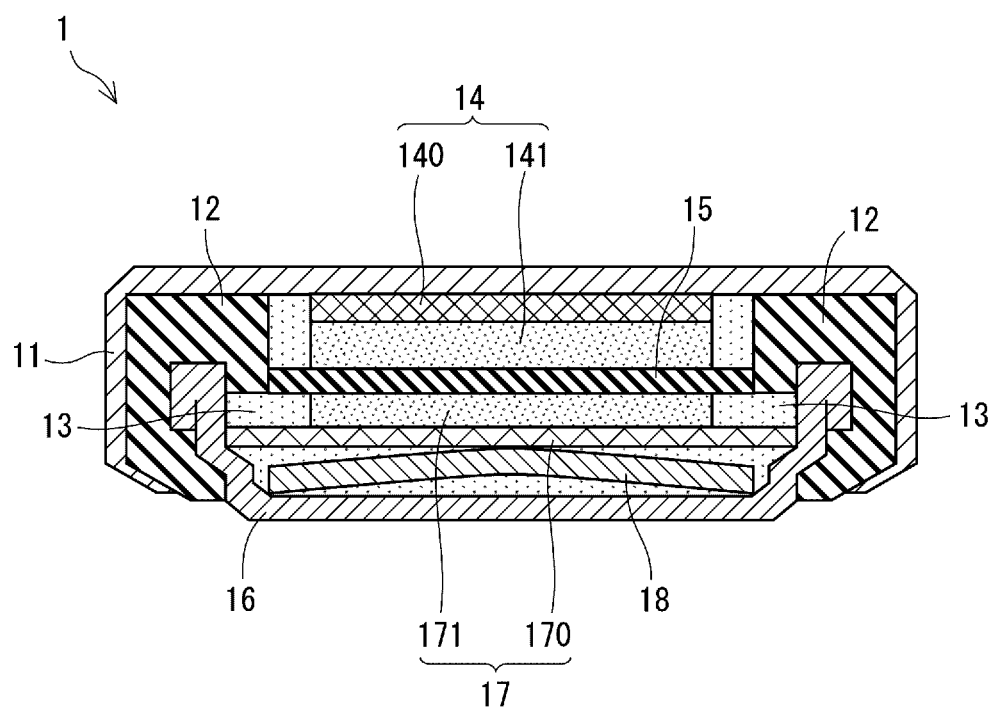
FIG. 2 is a cross sectional view schematically illustrating a lithium-ion secondary battery according to one embodiment of the present disclosure.

The battery service life estimation system of this embodiment of the present disclosure estimates a remaining service life of a secondary battery that contains a nonaqueous electrolyte. As one example of the secondary battery containing the non-aqueous electrolyte, a coin-type lithium ion secondary battery is exemplified and an exemplary structure thereof is illustrated in FIG. 2.

As illustrated there, the lithium-ion secondary battery 1 includes a cathode housing 11, a seal 12, and a non-aqueous electrolyte 13. The lithium-ion secondary battery 1 also includes a cathode 14, a separator 15, and an anode housing 16. Also included in the lithium-ion secondary battery 1 are an anode 17 and a holder 18, or the like. The cathode 14 is configured by including an collector 140 and an active material cathode layer 141 established on a surface of the collector 140. As active material that constitutes the active material cathode layer 141, lithium transition metal oxide, etc., having a layer structure is used. The anode 17 is configured by including an anode collector 170 and an active material anode layer 171 established on a surface of the anode collector 170. As active material that constitutes the active material anode layer 171, for example, carbon or the like is used. As the non-aqueous electrolyte 13, a solution prepared by dissolving a supporting electrolyte into organic solvent is used. The separator 15 electrically isolates the active material cathode layer 141 from the active material anode layer 171 while holding the non-aqueous electrolyte 13.

When such a secondary battery is used, it is known that a capacity of a secondary battery decreases as a usage time accumulates. Hence, one of conventional technologies estimates a remaining service life of the secondary battery. For example, as discussed earlier, a conventional system of JP-2013-254710-A estimates the remaining service life by calculating the formula composed of the first term that employs the exponentiation function and the second term that employs the square root function. However, actual degradation performance appearing in the end stage is different from the exponentiation function. Accordingly, an object of one embodiment of the present disclosure is to provide a battery service life estimation system capable of highly precisely estimating a battery service life, especially in the end stage of the battery service life.

Specifically, in FIG. 1, an outline structure of a battery service life estimation system 50 of this embodiment of the present disclosure is illustrated. The battery service life estimation system 50 includes a SOC calculator 6, an intersection time estimation unit 7 and a service life estimation unit 8. The SOC calculator 6 calculates a state of charge (SOC) based on a cell voltage V, a battery current I and a battery temperature T.

Figure 3A:
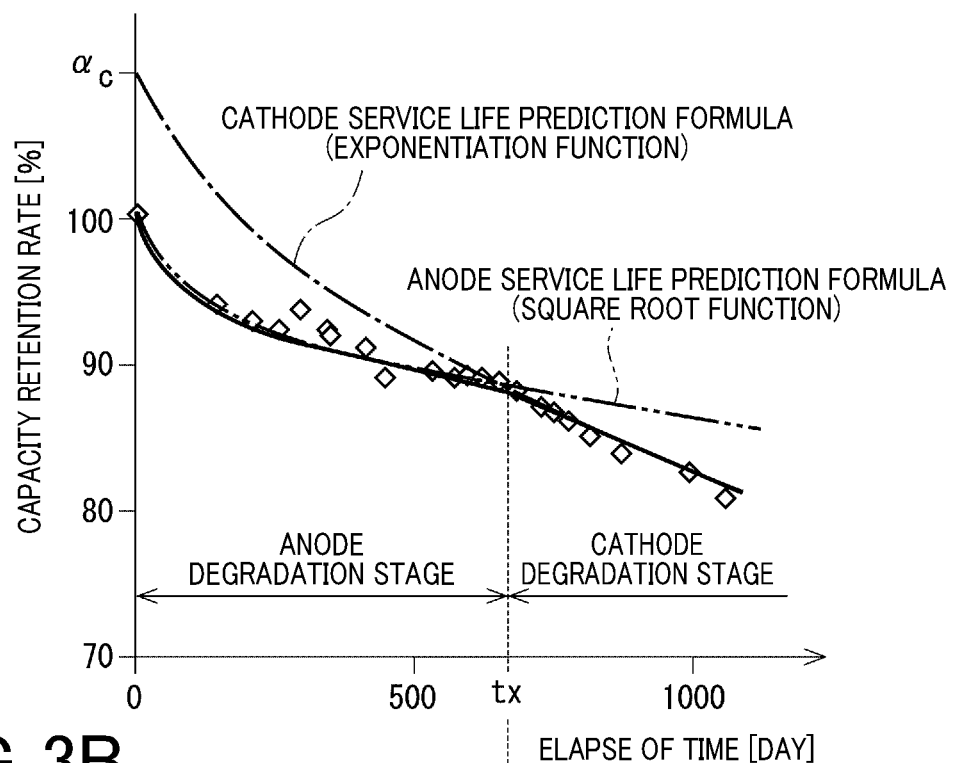
FIG. 3A is a graph illustrating an exemplary service life prediction line indicating a relation between a cumulative usage period and a capacity retention rate according to one embodiment of the present disclosure.

As illustrated in FIG. 3A, to represent a relation between a cumulative usage period and a capacity retention rate of the secondary battery 1 in this embodiment of the present disclosure, an anode service life prediction line obtained by calculating an anode service life prediction formula to indicate a service life of an anode 17 and a cathode service life prediction line obtained by calculating a cathode service life prediction formula to indicate a service life of a cathode 14 are utilized. Further, since the anode service life prediction line intersects with the cathode service life prediction line, a time when these prediction lines intersect with each other is defined as a prediction line intersection time tx. Hence, the intersection time estimation unit 7 detects a prediction line intersection time tx based on a rate of change in anode resistance R and notifies a result of such a detection to the service life estimation unit 8.

More specifically, the intersection time estimation unit 7 includes an calculator 71 to calculate an anode resistance R, an anode resistance changing rate $\Delta R$ and a difference $\Delta(\Delta R)$ between anode resistance changing rates $\Delta R$ in a given cycle. The intersection time estimation unit 7 also includes a memory 72 to store a result of these calculations performed by the calculator 71. Herein below, an ordinal number n is assigned to a presently executed calculation and an ordinal number n−1 is assigned to a just previously executed calculation. These ordinal numbers n−1 and n are attached to various symbols of calculation values as suffixes, respectively. The memory 72 holds a temperature dependency of the anode as already obtained.

The calculator 71 obtains a current I and a change $\Delta V$ in voltage V generated when constant current charge is performed, thereby detecting an anode resistance R in a prescribed SOC by using the below described method. The calculator 71 may obtain information of a battery temperature T and correct the anode resistance R based on the temperature dependency of the anode as well. Subsequently, by using the below listed first formula, the calculator 71 calculates a rate of change in anode resistance per unit time as a current value $\Delta Rn$ by dividing a difference between current and previous anode resistance values $Rn$ and $Rn-1$ by a unit time $\tau$. The calculator 71 then stores the current value $\Delta Rn$ in the memory 72. Herein below, the rate of change in anode resistance per unit time is referred to as the anode resistance changing rate for simplicity.

$$\Delta Rn = (Rn - Rn-1)/\tau \qquad \text{(First Formula)}$$

Further, by using below listed second formula, the calculator 71 calculates a current difference $\Delta(\Delta R)n$ based on a difference between current and previous anode resistance changing rates $\Delta Rn$ and $\Delta Rn-1$. The memory 72 holds the current difference $\Delta(\Delta R)n$ in it. The calculator 71 detects a time when the difference $\Delta(\Delta R)$ of the anode resistance changing rate changes from a value 0 to positive values and determines the time as a prediction line intersection time tx. However, the above-described value 0 should not be strictly interpreted as just the value 0 and can include a substantially value 0 in view of resolution of a detector and/or calculation error or the like.

$$\Delta(\Delta R)n = \Delta Rn - \Delta Rn-1 \qquad \text{(Second Formula)}$$

Further, a memory 82 included in the service life estimation unit 8 holds anode and cathode service life prediction formulas. Hence, upon receiving the prediction line intersection time tx from the intersection time estimation unit 7, a calculator 81 included in the service life estimation unit 8 estimates a battery service life by using the anode service life prediction formula before a point of the prediction line intersection time tx and the cathode service life prediction formula after the point of the prediction line intersection time tx, respectively.

Now, the anode and cathode service life prediction formulas are herein below described more in detail with reference to FIG. 3A, wherein a cumulative usage period, an anode capacity degradation rate, and a cathode capacity degradation rate are represented by reference characters t, Da and Dc, respectively. Also, proportional constants are represented by reference characters Ka and Kc, respectively. Here, each of these proportional constants Ka and Kc varies depending on a battery voltage V, a battery current I and a battery temperature T when a battery is used.

The anode service life prediction formula is indicated by a square root function of the cumulative usage period t as represented by the below listed third formula. The anode capacity retention rate is equal to a value obtained by subtracting the anode capacity degradation rate Da from 100%.

$$Da = Ka \cdot \sqrt{t} = (Ka \cdot t^{1/2}) \quad \text{(Third Formula)}$$

By contrast, the cathode service life prediction formula is indicated by an exponentiation function with a bottom of a cumulative usage period t as represented by the below listed fourth formula, wherein the exponent p is greater than a value 0.5. The cathode capacity retention rate is equivalent to a value obtained by subtracting the cathode capacity degradation rate Dc from an initial value ac which is obtained by adding an unused region as a secondary battery to 100%.

$$Dc = Kc \cdot t^p \quad \text{(Fourth Formula)}$$

Hence, since the exponent p is larger than 0.5 (i.e., ½) acting as an exponent of the square root function, the anode service life prediction and cathode service life prediction lines intersect with each other. Further, since the exponent p in the exponentiation function illustrated in FIG. 3A is less than value one (p<1), an inclination of a decline of the capacity retention rate decreases as the cumulative usage period t increases. However, an exponentiation function with an exponent of a value 1 or more (p≥1) can also be employed. That is, when the exponent p is equal to the value 1, the inclination of the decline of the capacity retention rate becomes constant. When the exponent p exceeds the value 1, the inclination of the decline of the capacity retention rate grows as the cumulative usage period t increases.

Figure 3B:
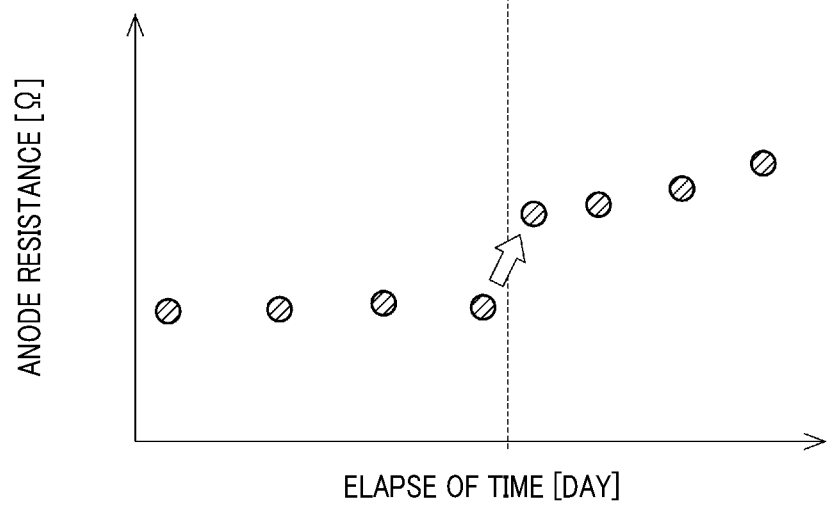
FIG. 3B is also a graph illustrating an exemplary change in anode resistance during a cumulative usage period according to one embodiment of the present disclosure.

Here, a period when the anode service life prediction line is lower than the cathode service life prediction line before a point of the prediction line intersection time tx is herein below called an anode degradation stage. By contrast, a period when the cathode service life prediction line is lower than the anode service life prediction line described the prediction line intersection time tx is herein below called a cathode degradation stage. That is, the prediction line intersection time tx is a time when the degradation modes are switched. Hence, according to this embodiment of the present disclosure, in view of a phenomenon in which the anode resistance sharply increases when a site of the degradation mode is switched from the anode degradation stage to the cathode degradation stage as shown in FIG. 3B, the intersection time estimation unit 7 estimates the prediction line intersection time tx based on such a change in anode resistance.

Figure 4:
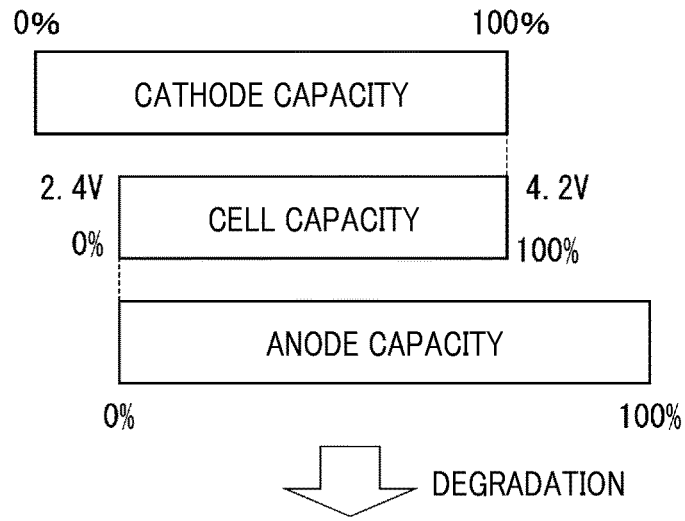
FIG. 4 is a set of graphs illustrating an exemplary relation among a cathode capacity, an anode capacity and a cell capacity in each of an initial stage, an anode degradation stage and a cathode degradation stage according to one embodiment of the present disclosure.
Figure 4:
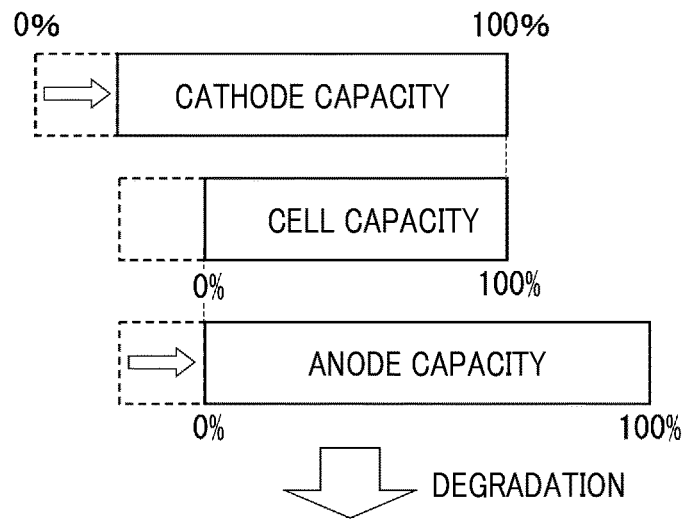
Figure 4:
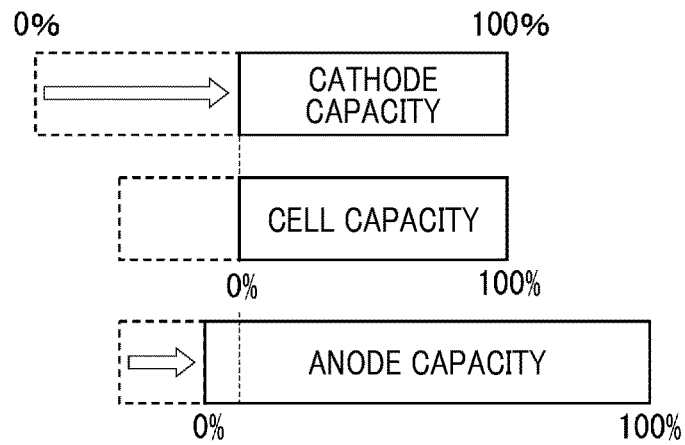
Figure 5:
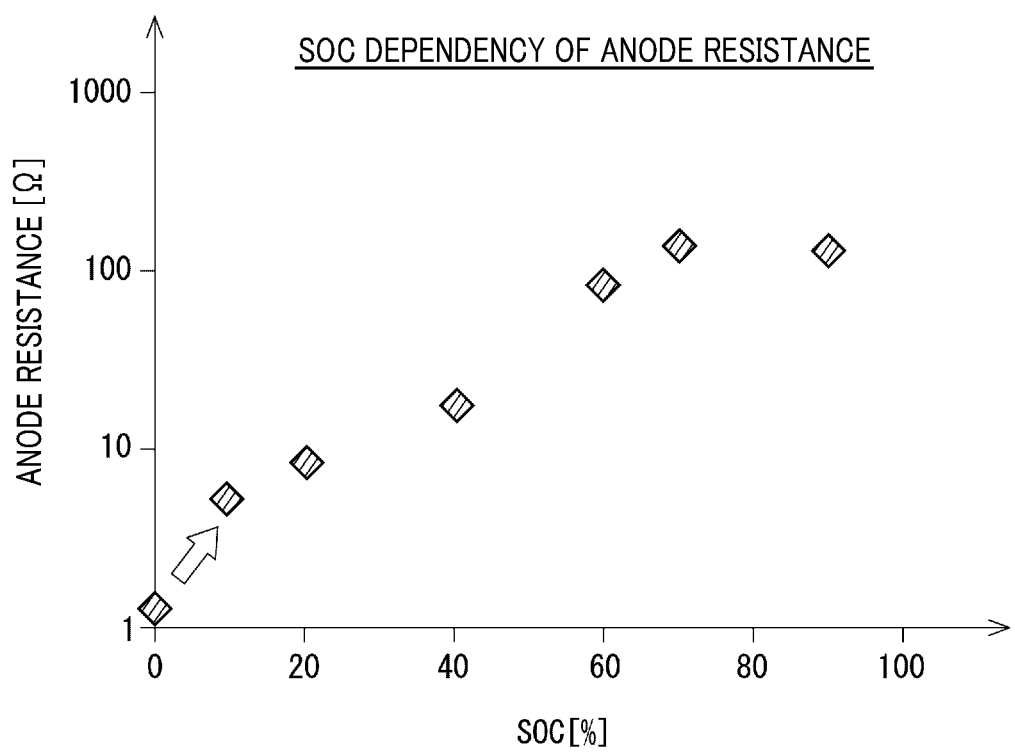
FIG. 5 is also a graph illustrating an exemplary SOC (state of charge) dependency of the anode resistance according to one embodiment of the present disclosure.

Now, an exemplary mechanism of rapid increase in anode resistance is described in detail with reference to FIGS. 4 and 5. FIG. 4 illustrates a relation among a cathode capacity, an anode capacity and a cell capacity in each of the initial stage, the anode degradation stage and the cathode degradation stage. As shown, in the initial stage (i.e., a non-degradation stage), a state of charge (SOC) 0% position (e.g., 2.4V) of the cell, is determined by a SOC 0% position of the anode. A given margin is allowed between a SOC 0% position of the cathode and the SOC 0% position of the cell. Further, a SOC 100% position of the cathode corresponds to a SOC 100% position (e.g., 4.2V) of the cell. A SOC 100% position of the anode exceeds the SOC 100% position of the cell.

By contrast, as shown in the middle of the drawing, due to growth of degradation from the initial stage in the anode degradation stage, the SOC 0% positions of the cathode and the anode shift toward the 100% positions, thereby narrowing ranges of the capacities, respectively. Hence, in the anode degradation stage, the SOC 0% position of the anode is greater than the SOC 0% position of the cathode. The SOC 0% position of the cell aligns with the SOC 0% position of the anode. That is, the below listed equality is established.

Cell SOC (0%)=Anode SOC (0%)

Subsequently, degradation of the cathode progresses faster than that of the anode. Hence, when the SOC 0% position of the cathode exceeds the SOC 0% position of the anode, a degradation stage is switched from the anode degradation stage to the cathode degradation stage as shown in the bottom of the drawing. In the cathode degradation stage, the SOC 0% position of the cell aligns with the SOC 0% position of the cathode. At the same time, a margin is allowed between the SOC 0% position of the anode and the SOC 0% position of the cell. That is, the below listed inequality is established.

Cell SOC (0%)<Anode SOC (i.e., greater than 0%)

Now, an exemplary SOC dependency of the anode resistance is described with reference to FIG. 5. As indicated by an arrow, when an anode SOC increases from 0%, an anode resistance also increases correspondingly. With such a mechanism, the anode resistance rapidly increases at a switching point where the degradation mode is switched from the anode degradation stage to the cathode degradation stage. Hence, in this embodiment of the present disclosure, the switch point for the degradation mode (i.e., the prediction line intersection time tx) is estimated by detecting the anode resistance.

Figure 6:
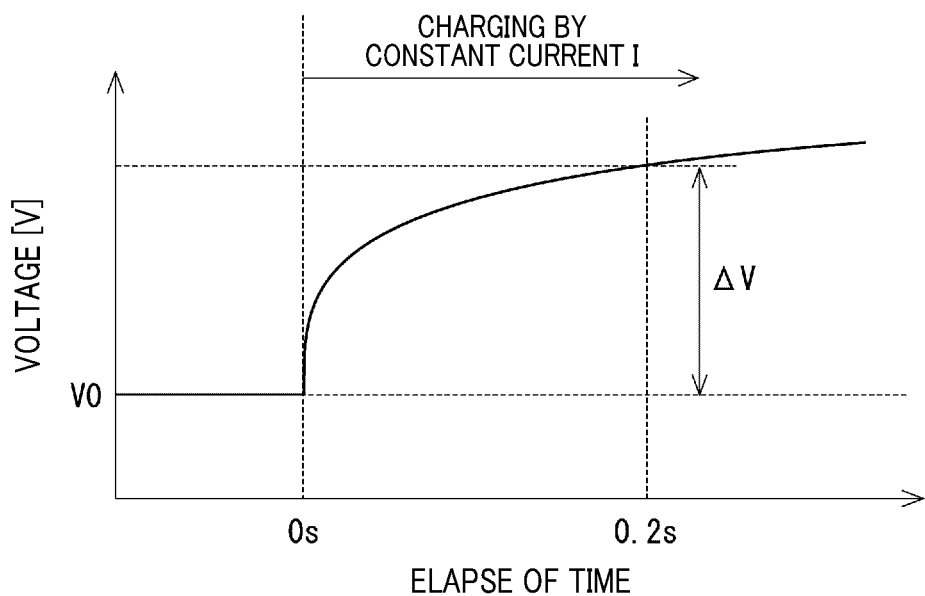
FIG. 6 is a graph illustrating an exemplary principle of detecting the anode resistance according to one embodiment of the present disclosure.

Specifically, FIG. 6 illustrates an exemplary method of detecting the anode resistance. In this embodiment of the present disclosure, a constant current charge is conducted in a low limit voltage state (i.e., a low limit SOC) as a specific SOC. For example, when battery pack control is performed in a system, the low limit SOC predetermined in battery pack control is used as the specific SOC. Here, it is preferable that such charging is performed on the battery at more than one capacity rate (1C).

As shown in the drawing, when charging by a constant current I starts, a voltage V steeply rises from an initial value V0 and then gradually increases. The intersection time estimation unit 7 detects a change in voltage V (i.e., ΔV) when the constant current I has been applied for a given time (e.g., 0.2 seconds) after the start of the charging. The intersection time estimation unit 7 calculates an anode resistance R by dividing the voltage change ΔV by the constant current I using the below listed fifth formula. Specifically, the anode resistance R is detected as an IV resistance based on the current I and the voltage V.

$$R = \frac{\Delta V}{I} \quad \text{(Fifth Formula)}$$

Here, in order to clearly reflect an anode resistance, an optimum time for applying the constant current is desirably set in view of a performance of the battery. For example, the optimum time can be determined in view of a frequency dependency of each of the cathode and anode resistances by investigating the frequency dependency with an AC impedance measuring method or the like.

Figure 7A:
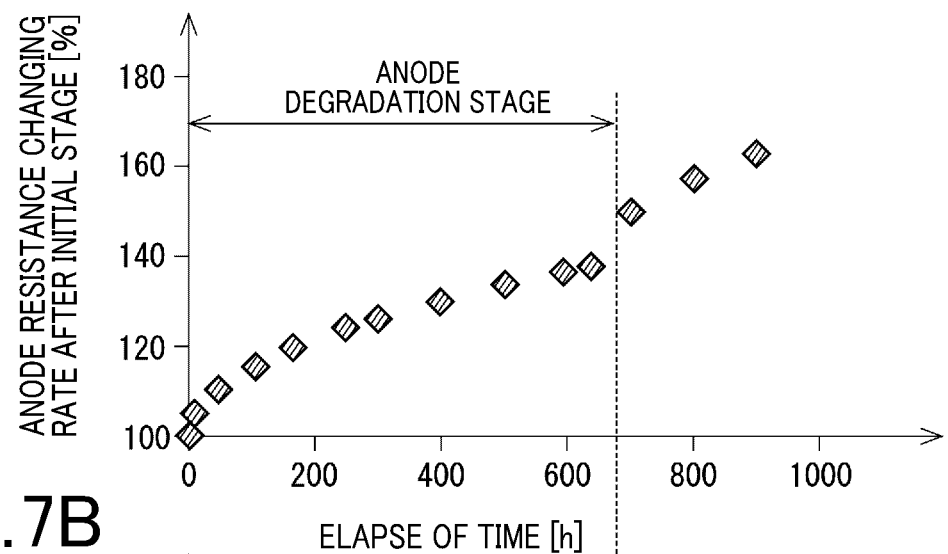
FIG. 7A is a graph illustrating an exemplary rate at which an anode resistance changes after an initial stage of a cumulative usage according to one embodiment of the present disclosure.
Figure 7B:
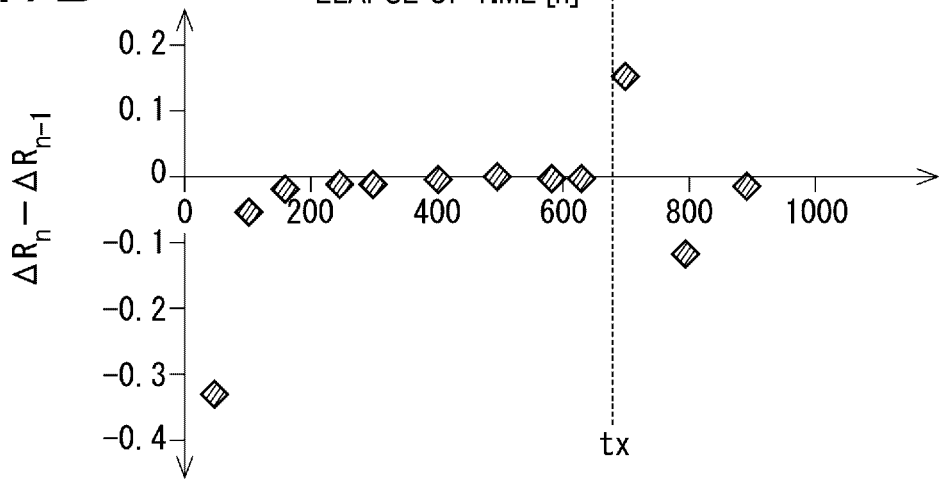
FIG. 7B is a graph illustrating an exemplary time history of a change in difference between current and previous anode resistances when the anode resistance varies according to one embodiment of the present disclosure.

Exemplary data obtained in this embodiment of the present disclosure is illustrated in FIG. 7. Here, a degradation condition employed in this embodiment of the present disclosure is as follows. As a configuration of a cell, the cathode is made of $LiNi_{1/3}Mn_{1/3}Co_{1/3}O_2$. The anode is made of HC (hard carbon). The temperature is 55 degree Celsius (° C.). The SOC varies from 10% to 90%. A capacity rate is 1C.

Further, a detection condition of detecting the anode resistance is as follows. That is, the temperature is 20° C. The specific SOC is 0% (i.e., a lower limit SOC). The capacity rate is 1C. A period for applying constant current is 0.2 seconds.

In upper part of FIG. 7A, a time history of a rate (e.g., a percentage) at which an anode resistance changes in relation to an initial anode resistance is illustrated. As shown there, the time history of the anode resistance shows a continuous curvature having a substantially constant inclination changing rate in an anode degradation stage up to about 650 h (hour). In a bottom of FIG. 7, a difference between anode resistance changing rates (i.e., ΔRn−ΔRn−1) is illustrated (i.e., plotted), which is equivalent to a second order difference of the anode resistance. As illustrated there, in the anode degradation stage, the difference (ΔRn−ΔRn−1) swings once to a negative region immediately in the initial stage thereof and then maintains almost a value zero (0). This means that the anode resistance changing rate per unit time changes linearly as a usage time increases (accumulates).

Further, when approximately 650 h has elapsed, the anode resistance discontinuously increases. Specifically, at that time, the differences of the anode resistance changing rate (i.e., ΔRn−ΔRn−1) changes from the value 0 to positive values. Hence, by detecting the event that the difference of the anode resistance changing rate (ΔRn−ΔRn−1) changes from the value 0 to the positive values, it can be determined that the degradation stage is switched from the anode degradation stage to the cathode degradation stage (i.e., a prediction line intersection time tx is reached).

Figure 8:
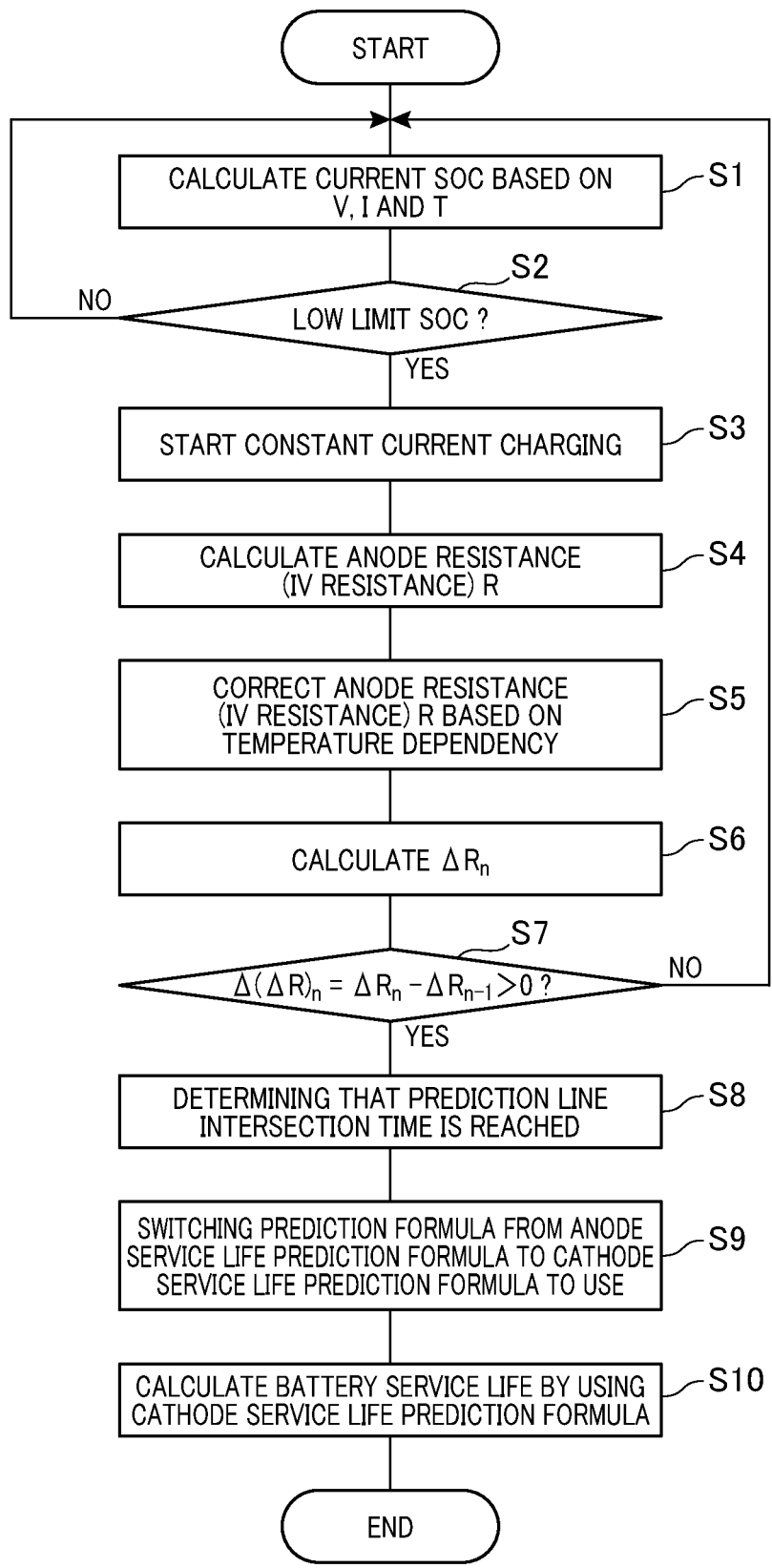
FIG. 8 is a flowchart illustrating an exemplary service life estimation sequence performed by a battery service life estimation system according to one embodiment of the present disclosure.

Now, an exemplary battery service life estimation process of this embodiment of the present disclosure is described with reference to a flowchart of FIG. 8, wherein and the following description as well a reference character S represents a step in the process. Specifically, in step S1, the SOC calculator 6 calculates a current SOC of the secondary battery 1 based on a battery voltage V, a battery current I, and a battery temperature T. In step S2, it is determined whether or not the current SOC is a low limit SOC. If an answer in S2 is positive (i.e., YES), the process proceeds to a step S3. By contrast, if the answer in step S2 is negative (i.e., NO), the process returns to the step S1.

Subsequently, the intersection time estimation unit 7 starts constant current charging in step S3, and calculates an I-V resistance (i.e., an anode resistance R) in step S4. Subsequently, the intersection time estimation unit 7 corrects the anode resistance R by using the anode temperature dependency in step S5. In step S6, the intersection time estimation unit 7 calculates a current anode resistance changing rate ΔRn. Subsequently, the intersection time estimation unit 7 determines if a current difference between anode resistance changing rates (i.e., Δ(ΔR)n) (=ΔRn−ΔRn−1)) is a positive value in step S7.

When the current difference between the anode resistance changing rates (i.e., Δ(ΔR)n) is substantially zero, a negative determination is made (i.e., No) in step S7 and the process returns to the step S1, thereby repeating calculation of the SOC. By contrast, when the current difference between the anode resistance changing rates (i.e., Δ(ΔR)n) changes from the value 0 to a positive value, a positive determination (i.e., Yes) is made in step S7, the process goes to a step S8. In step S8, the intersection time estimation unit 7 determines that the prediction line intersection time tx is currently reached and notifies a result of the determination to the service life estimation unit 8.

In step S9, the service life estimation unit 8 changes a prediction formula from an anode service life prediction formula to a cathode service life prediction formula to use in estimating a battery service life. Subsequently, in step S10, the service life estimation unit 8 estimates the battery service life by using the cathode service life prediction formula and completes the process.

As described heretofore, the battery service life estimation system 50 of one embodiment of the present disclosure stores the anode and cathode service life prediction formulas and switches the prediction formula from the anode service life prediction formula to the cathode service life prediction formula to be used in estimating a battery service life. Hence, by using the cathode service life prediction formula, the battery service life can be highly precisely estimated even in the end of the battery service life.

Specifically, the anode service life prediction formula is constituted by including the anode capacity degradation rate indicated by the square root function with a root of the cumulative usage period. Further, the cathode service life prediction formula is constituted by including the cathode capacity degradation rate indicated by the exponentiation function with the bottom of the cumulative usage period as well, in which the exponent p of the exponentiation function is larger than the value 0.5 (i.e., 0.5<p). When it is premised that the cathode capacity is greater than the anode capacity in the initial stage, the anode service life prediction line obtained by the anode service life prediction formula intersects with the cathode service life prediction line obtained by the cathode service life prediction formula during the cumulative usage period. Hence, by using such formulas, the degradation performance even in the end stage of the battery service life can be highly precisely reflected.

Further, according to one embodiment of the present disclosure, a time when a difference between the anode resistance changing rates (i.e., ΔRn−ΔRn−1) in the lower SOC as the specific SOC changes from the value 0 to the positive value is determined as the prediction line intersection time tx. Hence, accuracy of detecting the switching point at which the prediction formula is changed to the other prediction formula can be improved, thereby upgrading the service life prediction as well. Further, since the charging rate is set to more than 1C (one capacity rate) as the constant current charging condition when the anode resistance is detected, the battery service life can more precisely be estimated. Furthermore, since the anode resistance R already detected is corrected by the previously obtained temperature dependency of the anode, the anode resistance R can be detected at any temperature.

Especially, when the secondary battery is the layer structured secondary lithium-ion battery including the lithium transition metal oxide, the above-described advantage of the battery service life estimation system 50 of one embodiment of the present disclosure can be effectively obtained.

Now, various modifications of the above-described embodiments of the present disclosure are described herein below. First, although the lower SOC predetermined in the battery pack control is used as the specific SOC in one of the anode resistance detection conditions in the above-described embodiments of the present disclosure, a lower SOC determined by the other definition can be used as the specific SOC as well.

Secondly, the method of estimating the prediction line intersection time tx by using the intersection time estimation unit 7 is not limited to the method implemented based on the difference between the anode resistance changing rates. That is, instead of the changing rate obtained per unit time, an amount of change in anode resistance may also be directly monitored to be used as well. Otherwise, the intersection time estimation unit 7 may calculate a capacity based on the voltage V, the current I and the temperature T in a given cycle, and update the anode service life prediction line and the cathode service life prediction line every time, thereby directly estimating the intersecting point where these lines intersect with each other.

Thirdly, the battery service life estimation system of the present disclosure is not limited to a lithium ion secondary battery including a layer structured lithium transition metal oxide, and may be composed of the other active substances. Further, the battery service life estimation system may be applied to a secondary battery containing non-aqueous electrolyte.

Numerous additional modifications and variations of the present disclosure are possible in light of the above teachings. It is therefore to be understood that within the scope of the appended claims, the present disclosure may be executed otherwise than as specifically described herein. For example, the A battery service life estimation system is not limited to the above-described various embodiments and may be altered as appropriate. Similarly, the A battery service life estimation method is not limited to the above-described various embodiments and may be altered as appropriate.

What is claimed is:

1. A battery service life estimation system for estimating a service life of a secondary battery composed of an anode, a cathode and a non-aqueous electrolyte, a state of charge (SOC) zero % condition of the anode causing a SOC zero % condition of the secondary battery in a primary state of health (SOH) stage in which the anode linearly degrades faster than the cathode, and a SOC zero % condition of the cathode causing a SOC zero % condition of the secondary battery in a secondary SOH stage in which the cathode degrades faster than the anode after the primary SOH stage, the battery service life estimation system comprising:

a memory configured to store an anode service life prediction formula indicating a service life of the anode and a cathode service life prediction formula indicating a service life of the cathode; and one or more processors programmed to function as:

an SOC calculator that calculates an SOC of the secondary battery at least based on a battery voltage and a battery current flowing through the secondary battery;

an SOC detector that detects whether the SOC of the secondary battery is in a lowest level of zero %;

a first calculator that generates a prediction line intersection time at which an anode service life prediction line intersects with a cathode service life prediction line on a plane coordinate system, the first calculator generating the anode service life prediction line by calculating the anode service life prediction formula on the plane coordinate system to indicate the service life of the anode, the first calculator generating the cathode service life prediction line on the plane coordinate system by calculating the cathode service life prediction formula to indicate the service life of the cathode, the plane coordinate system including two coordinate axes respectively indicating a cumulative usage period and a capacity retention rate indicating an SOH of the secondary battery containing the non-aqueous electrolyte, the first computer calculating an anode resistance R, an anode resistance changing rate $\Delta R$, and a difference $\Delta(\Delta R)$ between previous and current anode resistance changing rates $\Delta R$ in a given cycle when the SOC detector has detected the lowest SOC of zero %, the primary SOH stage ending at the prediction line intersection time, the secondary SOH stage starting from the prediction line intersection time, and the first computer identifying the prediction line intersection time by detecting a change in a difference between current and previous anode resistance changing rates $(\Delta R_n - \Delta R_{n-1})$ from a value 0 (zero) to a positive value; and a second calculator calculating the battery service life based on the anode service life prediction formula before a point of the prediction line intersection time, and the second calculator calculating the battery service life based on the cathode service life prediction formula after the point of the prediction line intersection time.

2. The battery service life estimation system as claimed in claim 1, wherein:

the anode service life prediction formula is represented by the below listed formula, a reference character Da represents an anode capacity degradation rate, a reference character Ka represents a proportional constant, and a reference character t represents a cumulative usage period when the secondary battery is used, $$Da = Ka\sqrt{t},$$

the cathode service life prediction formula is represented by the below listed formula, a reference character Dc represents a cathode capacity degradation rate, a reference character Kc represents a proportional constant, and a reference character t represents a cumulative usage period when the secondary battery is used, $$Dc = Kc \cdot t^p \quad (0.5 < p).$$

3. The battery service life estimation system as claimed in Claim 1, wherein the anode resistance is calculated based on a change in voltage when a battery is charged by a constant current at more than 1C.

4. The battery service life estimation system as claimed in claim 1, wherein the anode resistance is corrected based on a previously obtained temperature dependency of the anode.

5. The battery service life estimation system as claimed in claim 1, wherein the SOC is a low limit SOC of the secondary battery.

6. The battery service life estimation system as claimed in claim 1, wherein the secondary battery is a lithium-ion secondary battery including lithium transition metal oxide having a layered structure.

7. A method of estimating a battery service life of a secondary battery composed of an anode, a cathode and a non-aqueous electrolyte, a state of charge (SOC) zero % condition of the anode causing a SOC zero % condition of the secondary battery in a primary state of health (SOH) stage in which the anode linearly degrades faster than the cathode, and a SOC zero % condition of the cathode causing a SOC zero % condition of the secondary battery in a secondary SOH stage in which the cathode degrades faster than the anode after the primary SOH stage, the method comprising steps of:

storing, in a memory, a below defined anode service life prediction formula indicating a service life of the anode, wherein a reference character Da represents an anode capacity degradation rate, a reference character Ka represents a proportional constant, and a reference character t represents a cumulative usage period when a secondary battery is used, $Da = Ka\sqrt{t}$, storing, in the memory, a below defined cathode service life prediction formula indicating a service life of the cathode, wherein a reference character Dc represents a cathode capacity degradation rate, a reference character Kc represents a proportional constant, and a reference character t represents a cumulative usage period when a secondary battery is used, $Dc = Kc \cdot t^p$ (0.5<p), calculating an SOC of the secondary battery at least based on a battery voltage and a battery current flowing through the secondary battery;
  detecting whether a current SOC is a lowest level of zero %;
  charging the secondary battery with a constant current when the current SOC is the lowest level of zero %;
  generating an anode service life prediction line on a plane coordinate system to indicate the service life of the anode by calculating the anode service life prediction formula,
  generating a cathode service life prediction line on the plane coordinate system to indicate the service life of the cathode by calculating the cathode service life prediction formula,
  calculating an I-V resistance as an anode resistance (R) of the anode when the current SOC is the lowest level of zero % and the secondary battery is charged with a constant current;
  calculating an anode resistance changing rate (ΔR) generated per unit time, the unit time being an interval between previous and current SOC calculations of calculating the SOC of the secondary battery;
  calculating an amount of difference $(\Delta R_n - \Delta R_{n-1})$ between current and previous anode resistance changing rates;
  determining a prediction line intersection time at which the anode service life prediction line intersects with the cathode service life prediction line on the plane coordinate system by detecting a change in amount of difference between current and previous anode resistance changing rates $(\Delta R_n - \Delta R_{n-1})$ from a value 0 to a positive value;
  calculating a battery service life based on the anode service life prediction formula before a point of the prediction line intersection time; and
  calculating the battery service life based on the cathode service life prediction formula after the point of the prediction line intersection time.

8. A method of estimating a battery service life of a secondary battery composed of an anode, a cathode, and a non-aqueous electrolyte, a state of charge (SOC) zero % condition of the anode causing a SOC zero % condition of the secondary battery in a primary state of health (SOH) stage in which the anode linearly degrades faster than the cathode, a SOC zero % condition of the cathode causing a SOC zero % condition of the secondary battery in a secondary SOH stage in which the cathode degrades faster than the anode after the primary SOH stage, the method comprising steps of:

storing, in a memory, an anode service life prediction formula indicating a service life of the anode;
  storing, in the memory, a cathode service life prediction formula indicating a service life of the cathode;
  calculating an SOC of the secondary battery at least based on a battery voltage and a battery current flowing through the secondary battery;
  detecting whether a current SOC of the secondary battery is zero %;
  charging the secondary battery with a constant current when the current SOC of the secondary battery 1 is zero %;
  generating an anode service life prediction line on a plane coordinate system to indicate the service life of the anode by calculating the anode service life prediction formula when the current SOC of the secondary battery 1 is zero %;
  generating a cathode service life prediction line on the plane coordinate system to indicate the service life of the cathode by calculating the cathode service life prediction formula when the current SOC of the secondary battery 1 is zero %,
  calculating an I-V resistance as an anode resistance (R) of the anode when the current SOC of the secondary battery is zero % and the secondary battery is charged with a constant current;
  calculating an anode resistance changing rate (ΔR) generated per unit time (in step S6), the unit time being an interval between previous and current SOC calculations of calculating the SOC of the secondary battery;
  calculating an amount of difference $(\Delta R_n - \Delta R_{n-1})$ between current and previous anode resistance changing rates;
  determining a prediction line intersection time at which the anode service life prediction line intersects with the cathode service life prediction line on the plane coordinate system by detecting a change in amount of difference between current and previous anode resistance changing rates $(\Delta R_n - \Delta R_{n-1})$ from a value 0 to a positive value;
  calculating a battery service life based on the anode service life prediction formula before a point of the prediction line intersection time; and
  calculating the battery service life based on the cathode service life prediction formula after the point of the prediction line intersection time.

* * * * *